(12) United States Patent
Chiu et al.

(10) Patent No.: US 12,463,089 B2
(45) Date of Patent: Nov. 4, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Te-Hsin Chiu, Miaoli County (TW); Shih-Wei Peng, Hsinchu (TW); Wei-An Lai, Taichung (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 112 days.

(21) Appl. No.: 18/344,565

(22) Filed: Jun. 29, 2023

(65) Prior Publication Data

US 2023/0352339 A1  Nov. 2, 2023

Related U.S. Application Data

(62) Division of application No. 17/533,000, filed on Nov. 22, 2021, now Pat. No. 11,721,576.

(Continued)

(51) Int. Cl.
*H01L 21/762* (2006.01)
*H01L 21/3115* (2006.01)
(Continued)

(52) U.S. Cl.
CPC .. *H01L 21/76243* (2013.01); *H01L 21/31155* (2013.01); *H01L 21/743* (2013.01); *H01L 22/14* (2013.01)

(58) Field of Classification Search
CPC ......... H01L 21/77; H01L 21/78; H01L 21/82; H01L 21/822; H01L 21/8221;
(Continued)

(56) References Cited

U.S. PATENT DOCUMENTS

2006/0175607 A1* 8/2006 Matsumiya ............. H01L 22/34
257/48
2011/0294270 A1  12/2011 Nishisaka
2018/0033705 A1  2/2018 Philippou et al.

FOREIGN PATENT DOCUMENTS

CN  101667598 A  3/2010
CN  101807603 A  8/2010
(Continued)

OTHER PUBLICATIONS

First Taiwan Office Action issued in connection with TW Appl. Ser. No. 111102286 dated Dec. 23, 2022 (without English translation).
(Continued)

*Primary Examiner* — Julio J Maldonado
*Assistant Examiner* — Stanetta D Isaac
(74) *Attorney, Agent, or Firm* — FOLEY & LARDNER LLP

(57) ABSTRACT

A method includes doping a region through a first surface of a semiconductor substrate; forming a plurality of doped structures within the semiconductor substrate, wherein each of the plurality of doped structures extends along a vertical direction and is in contact with the doped region; forming a plurality of transistors over the first surface, wherein each of the transistors comprises one or more source/drain structures electrically coupled to the doped region through a corresponding one of the doped structures; forming a plurality of interconnect structures over the first surface, wherein each of the interconnect structures is electrically coupled to at least one of the transistors; and testing electrical connections between the interconnect structures and the transistors based (Continued)

on detecting signals present on the doped region through a second surface of the semiconductor substrate, the second surface opposite to the first surface.

20 Claims, 8 Drawing Sheets

Related U.S. Application Data

(60) Provisional application No. 63/140,331, filed on Jan. 22, 2021.

(51) Int. Cl.
  *H01L 21/66* (2006.01)
  *H01L 21/74* (2006.01)

(58) Field of Classification Search
  CPC ....... H01L 21/26533; H01L 21/823431; H01L 21/823475; H01L 22/00; H01L 22/10; H01L 22/14; H01L 22/20; H01L 22/32; H01L 22/34; H10D 88/01; H10D 88/101; H10D 84/0149; H10D 84/038; H10D 84/0158; H10D 84/834

See application file for complete search history.

(56) References Cited

FOREIGN PATENT DOCUMENTS

| CN | 107026128 A | 8/2017 |
| CN | 107665882 A | 2/2018 |
| JP | 2007-311752 A | 11/2007 |

OTHER PUBLICATIONS

Non-Final Office Action on U.S. Appl. No. 17/533,000 DTD Dec. 8, 2022.
Notice of Allowance on U.S. Appl. No. 17/533,000 DTD Mar. 22, 2023.
Office Action issued in Chinese Appl. No. 202210060103.1 dated Jul. 11, 2025.

\* cited by examiner

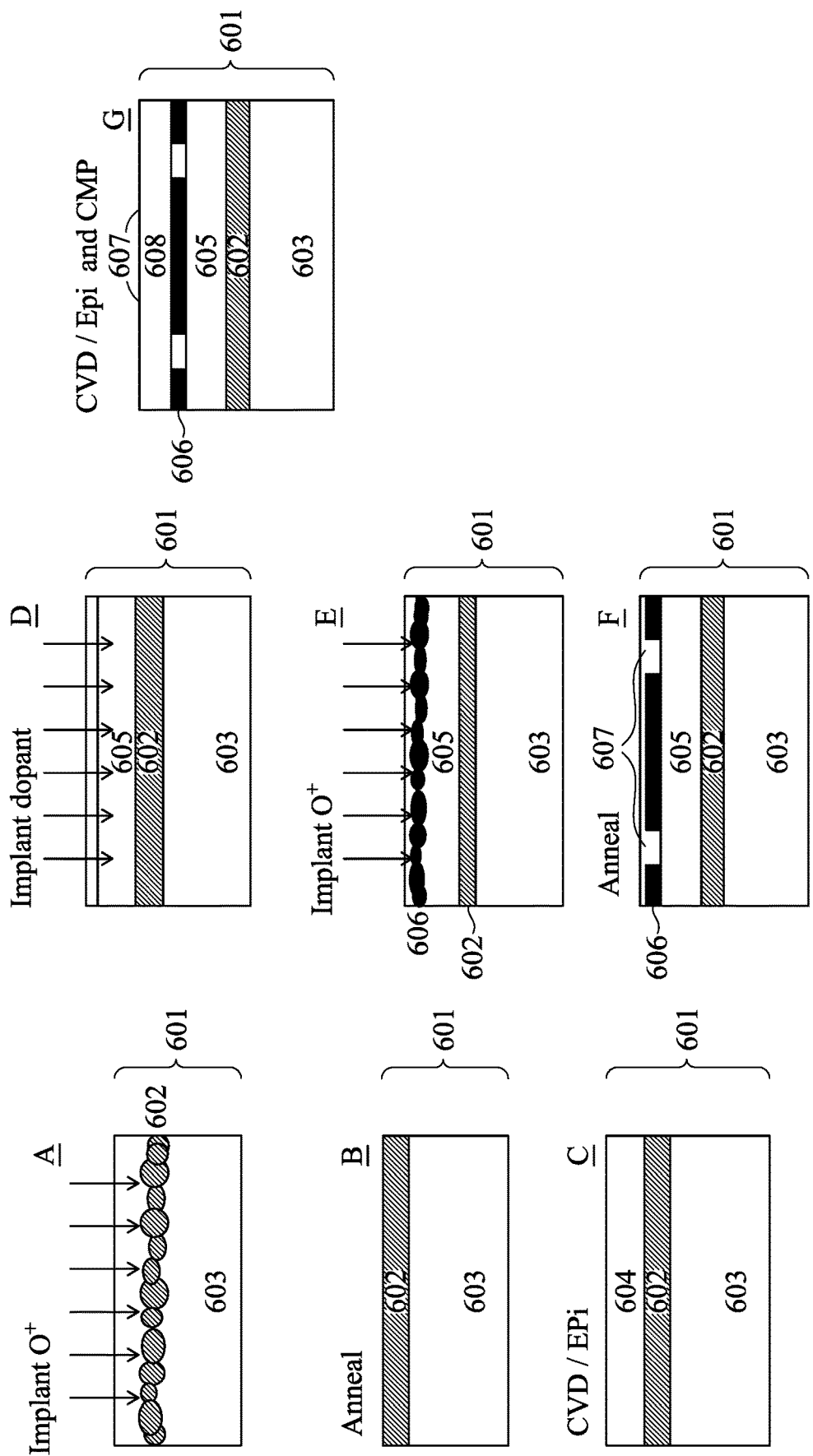
Fig. 6A-G

SEMICONDUCTOR DEVICES AND METHODS OF MANUFACTURING THEREOF

CROSS-REFERENCE TO RELATED APPLICATION

This application is a divisional of U.S. Non-Provisional application Ser. No. 17/533,000, filed Nov. 22, 2021, entitled "SEMICONDUCTOR DEVICES AND METHODS OF MANUFACTURING THEREOF," which claims priority to and the benefit of U.S. Provisional Application No. 63/140, 331, filed Jan. 22, 2021, entitled "BURIED DOPING LAYER METHODOLOGY FOR FRONTSIDE YIELD VERIFICATION ON BACKSIDE POWER RAIL PROCESS," which is incorporated herein by reference in its entirety for all purposes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A-G show cross-sections illustrating steps of a method of making a semiconductor device, which involves testing a front side circuitry before forming a back side circuitry.

DETAILED DESCRIPTION

Figure 1:
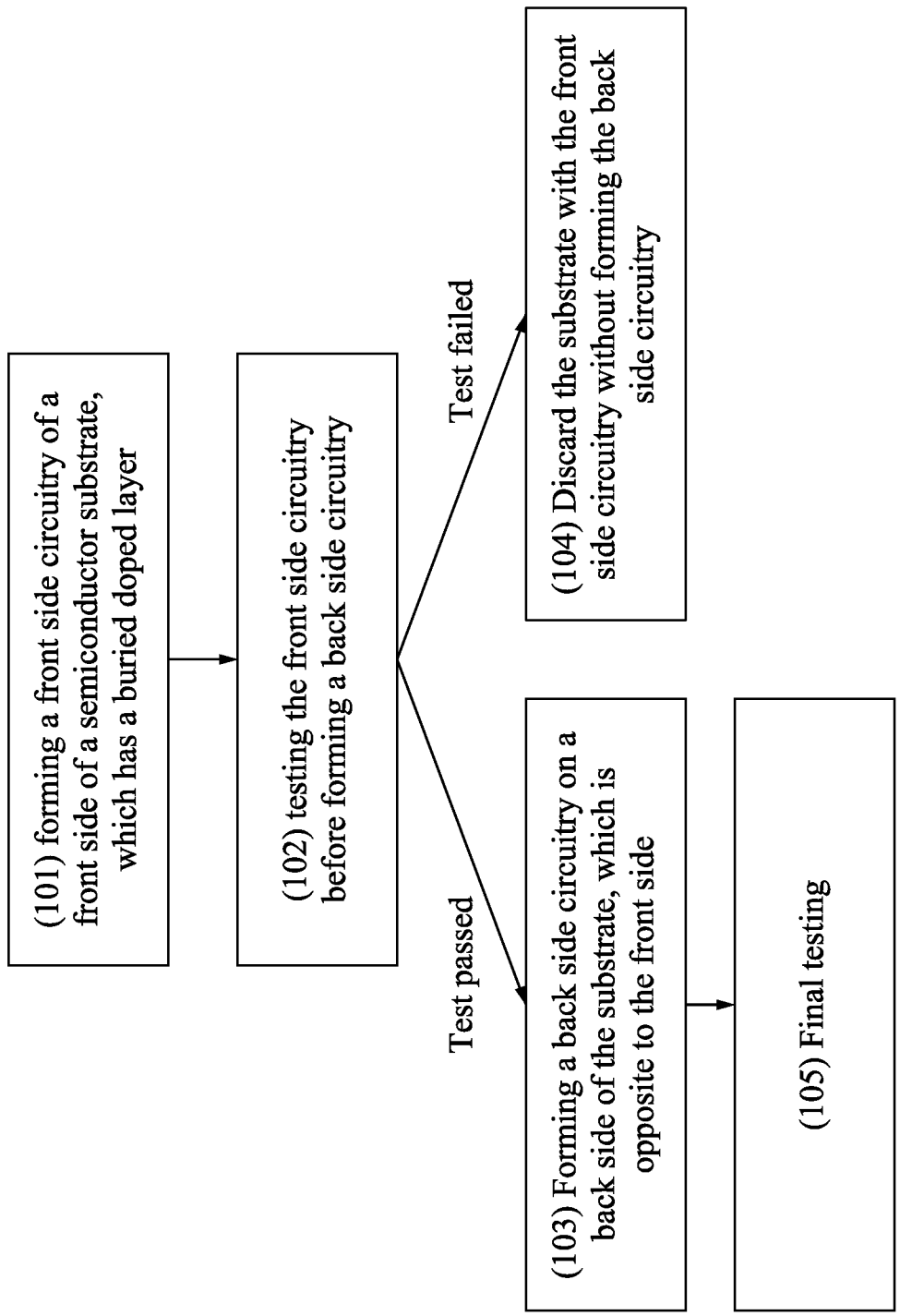
FIG. 1 illustrates the general methodology of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One of ways for miniaturization of integrated circuitry is through using a circuitry of a back side, which is opposite to a front side, of a substrate, i.e. through using a back side circuitry. Such back side circuitry may comprise, for example, a back side power rail. Using the back side circuitry may allow using smaller circuitry elements of the front side of the substrate, i.e. in a front side circuitry. However, fabrication of the back side circuitry is an expensive process. The cost of fabricating the back side circuitry may be wasted if there are defects in the front side circuitry.

The present disclosure proposes a methodology for making a semiconductor device. The methodology, which is schematically illustrated on the flow chart of FIG. 1, may include 101: forming a front side circuitry of a front side of a semiconductor substrate, which has a buried doped semiconductor layer; 102: testing the front side circuitry before forming a circuitry on a back side, which is opposite to the front side, of the substrate; 103: if the front side circuitry passes testing 102, then a back side circuitry is formed; 104: if the front side circuitry does not pass testing 102, the semiconductor substrate with the front side circuitry may be discarded. For a device which passed testing 102 and for which a back side circuitry is formed in step 103, a final testing 105 may be performed. The final testing may involve testing the front-side and/or the back-side circuitry.

Figure 2A:
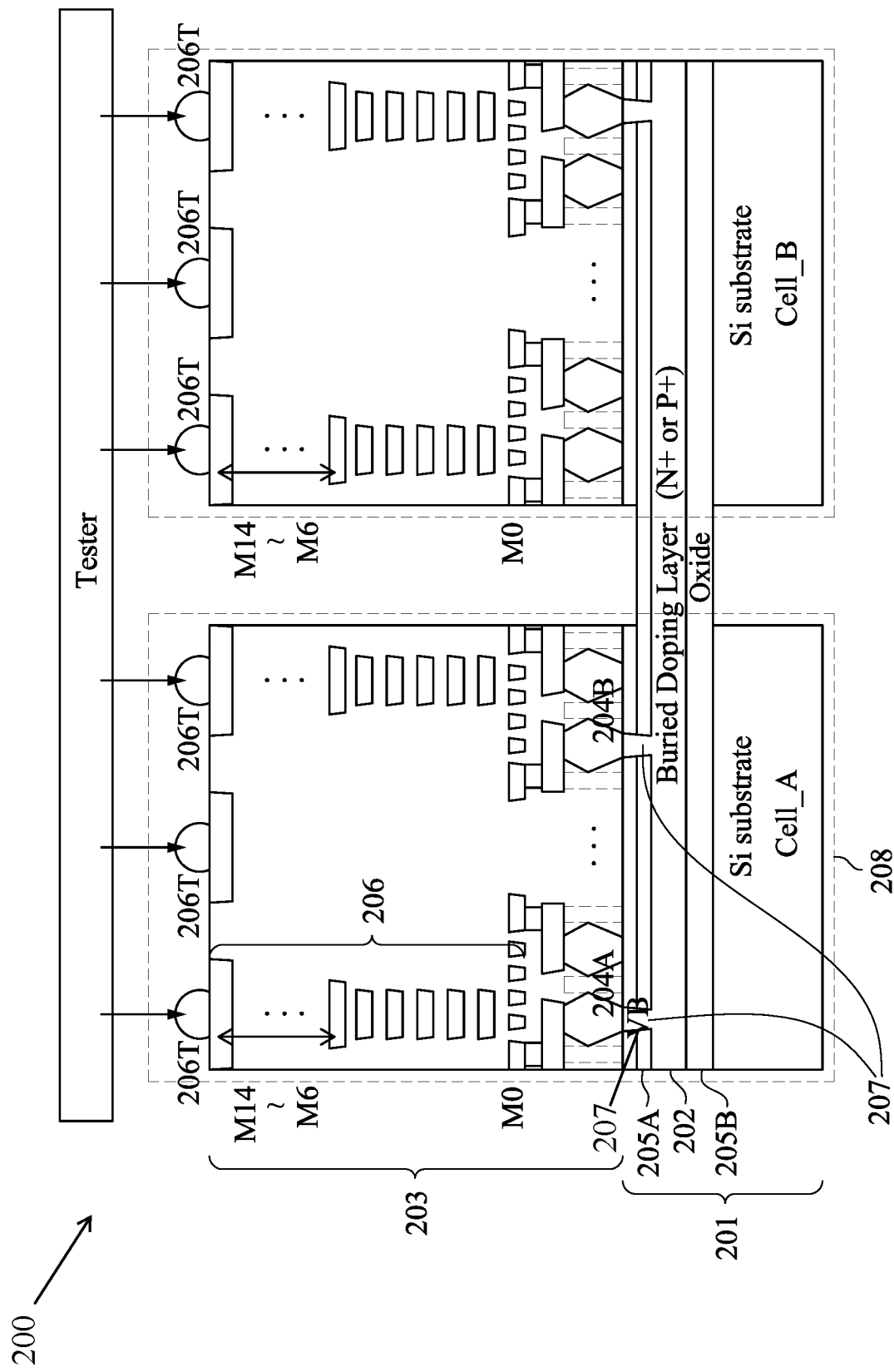
FIG. 2A schematically illustrates a structure, which includes a substrate with a buried doping layer, which has a front side circuit, but does not have a back side circuit formed.

FIG. 2A schematically illustrates structure (or a partially formed semiconductor device) 200 formed in element (101) of FIG. 1. The structure in FIG. 2A includes semiconductor substrate 201. Substrate 201 may include a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. The substrate may include an epitaxial layer. For example, the substrate may have an epitaxial layer overlying a bulk semiconductor.

In accordance with various embodiments, substrate 201 may include buried doped semiconductor layer 202, which may serve as a sacrificial layer configured to test a front side circuitry of substrate 201 before forming any circuitry on a back side of substrate 201. Buried doped semiconductor layer 202 may be a n-doped layer or a p-doped layer. Substrate 201 may include dielectric layers 205A and 205B on opposite sides on buried doped semiconductor layer 202. Each of dielectric layers 205A and 205B may be an oxide layer, which may be formed of an oxide of the semiconductor material of substrate 201.

Structure 200 include front side circuitry 203 on the top surface of substrate 201. Front side circuitry 203 includes a plurality of transistors 204, such as transistors 204A and 204B. A first subgroup of transistors 204 may form a first cell, cell A, (which can correspond to a first circuit), while a second subgroup of transistors 204 may form a second cell, cell B (which can correspond to a second circuit), as shown in FIG. 2A. The transistors may include transistors selected from three-dimensional transistors, such as three-dimensional field-effect-transistors (e.g., FinFETs), gate-all-around (GAA) transistors (e.g., nanosheet transistors), and/or planar transistors such as metal-oxide-semiconductor field-effect-transistors (MOSFETs). Each of the transistors includes an active region, which may be a fin-shaped region of one or more three-dimensional field-effect-transistors (e.g., FinFETs), a sheet-shaped region of one or more gate-all-around (GAA) transistors (e.g., nanosheet transistors), a wire-shaped region of one or more GAA transistors (e.g., nanowire transistors), or an oxide-definition (OD) region of one or more planar metal-oxide-semiconductor field-effect-transistors (MOSFETs). Portions of the active region may each serve as a source structure or drain structure (or feature) of the respective transistor(s); and portions of the active region may each serve as a conduction channel of the respective transistor(s).

One or more of transistors 204 may be electrically connected to buried doped semiconductor layer 202 through interconnecting structure(s) 207, which may extend through a thickness of dielectric layer 205 from the top surface of substrate 201. Interconnecting structure(s) 207 may be formed of a doped semiconductor, such as a doped silicon, a doped germanium or a doped SiGe. In certain embodiments each of transistors 204 may be electrically connected to buried doped semiconductor layer through interconnecting structure 207. For example, each of transistors 204 may include one or more source/drain which may be electrically coupled or connected to buried doped semiconductor layer 202 through interconnection structure 207.

Front side circuitry 203 also includes electrical interconnection 206 which may provide electrical interconnection between transistors 204. Interconnection 206 may include a number of metallization layers on the front side (e.g., a bottommost metallization layer on the front side, typically referred to as M0). Structure 200 does not include electrical circuitry on back side 208 of substrate 201.

Figure 2B:
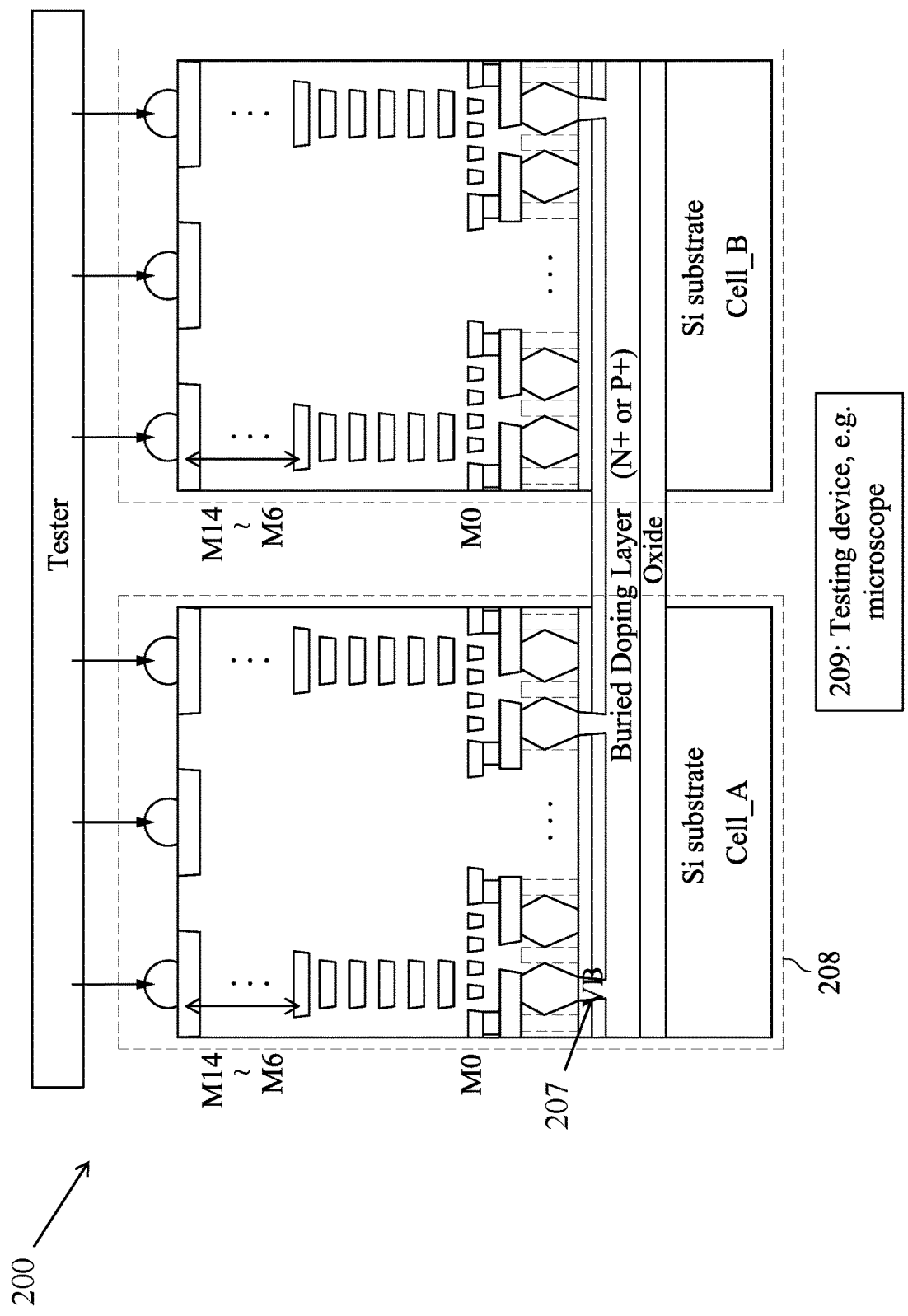
FIG. 2B schematically illustrates testing the front side circuit of the substrate from FIG. 2A using a testing device, such as a microscope, placed facing the back side of the substrate.

FIG. 2B schematically illustrates testing element 102 of FIG. 1, i.e. testing of front side circuitry 203 of structure 200. Testing 102 may involve placing testing device 209 facing back side 208 of substrate 201. Testing device 209 may be, for example, a microscope, such as a photon microscope, such as an emission microscope (EMMI) or an electron beam microscope, such as an electron beam irradiation microscope (EBI). Testing 102 may include applying an electrical signal through a topmost front side metallization layer(s) 206T to front side circuit 203 and detecting a signal, which may comprise, for example, photons and/or electrons, such as secondary electrons, passing through buried doped layer 202 using testing device 209. Testing 102 may include testing electrical interconnections 206 between transistors 204. Structure 200 (or its front side circuitry 203 or electrical interconnections 206) may pass testing 102 if no undesirable events or issues, such as defective electrical connections, such as electrical opens or electrical shorts, between the interconnect structures in metallization layers and the transistors, defective electrical connections, such as electrical opens or electrical shorts, between the interconnect structures in metallization layers, and/or defective electrical connections, such as electrical opens or electrical shorts, the between the transistors, have been observed or a number of undesirable events or issues is within a predefined threshold.

In some embodiments, the testing device may be an Emission microscope (EMMI). The EMMI microscope may perform an Emission microscopy analysis, which may be an efficient optical analysis technique used to detect and localize certain integrated circuit (IC) failures. Emission microscopy is non-invasive and can be performed from either the front or back of devices. For example, many defects in an integrated circuit may induce faint light emission in the visible and near infrared (IR) spectrum.

The EMMI microscope may comprise a sensitive camera to view and capture these optical emissions, allowing device detecting and localizing certain IC defects. Since emissions can be detected from the back side, the EMMI microscope may also include a laser, such as an IR laser, to create an overlay image of circuitry. This may allow failures to be related directly to circuit features, speeding failure resolution. A typical EMMI photo may include or consist of an overlay of two images: the circuitry and the emission spots. Each may be arbitrarily colorized a different way for clarity.

Figure 2C:
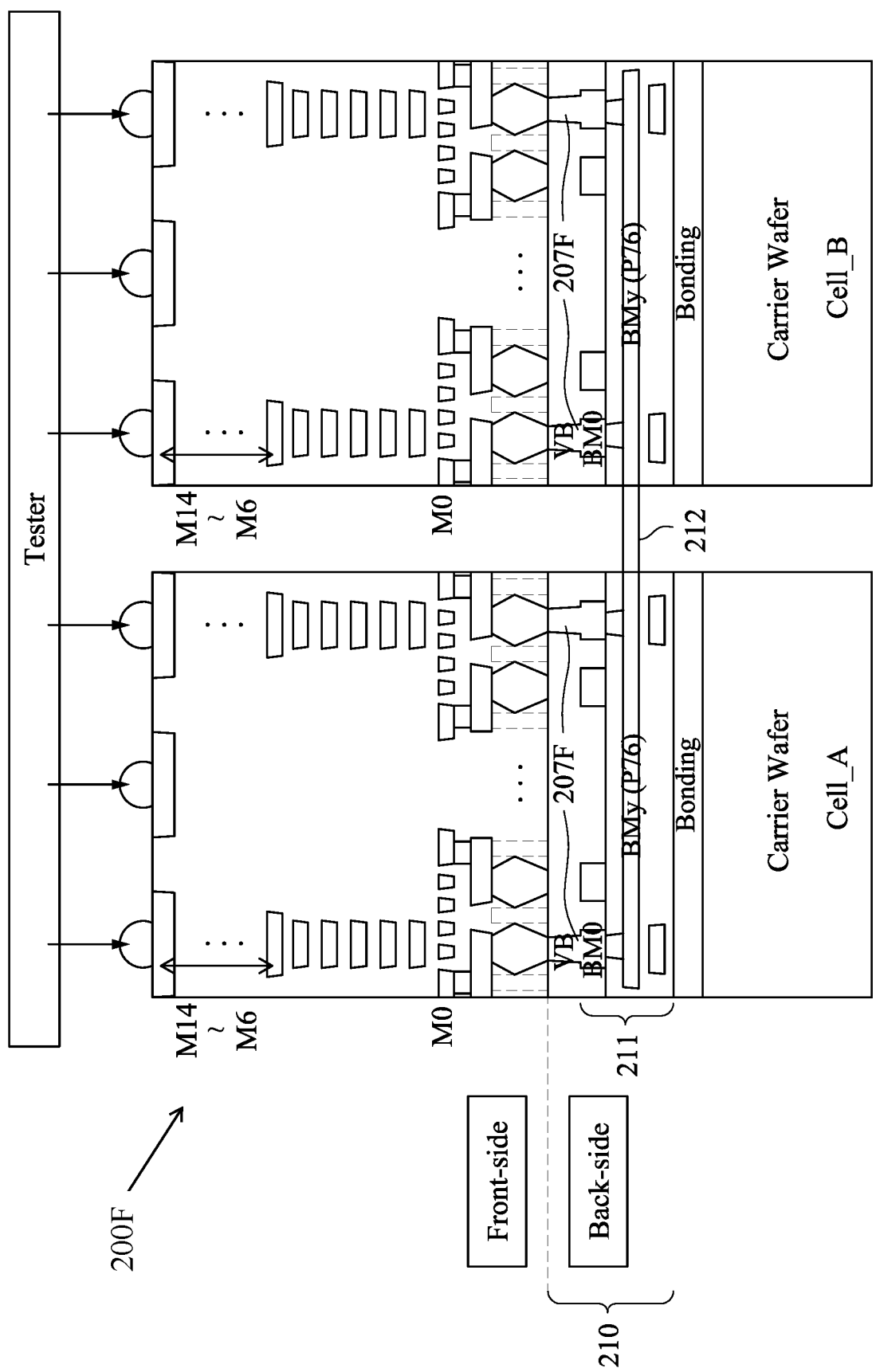
FIG. 2C schematically illustrates a final structure which is formed from the structure of FIG. 2A if its front side circuit passed the test of FIG. 2B. The final structure in FIG. 2C has the same front side circuit as the structure in FIG. 2A and a back side circuit.

FIG. 2C schematically illustrates semiconductor device 200F, which may be formed from structure 200 if front side circuit 203, including front side electrical interconnections 206, pass testing 102. Semiconductor device 200F includes the same front circuitry 203. However, semiconductor device 200F also includes back side circuitry 210. Back side circuitry 210 includes interconnecting structure(s) 207F, which may extend through the thickness of dielectric layer 205A. Interconnecting structure(s) 207F may be formed by replacing the doped semiconductor of interconnecting structure(s) 207 with a metal, which may be, for example, selected from the group consisting of tungsten, ruthenium, copper, titanium, and their alloys. Compared to structure 200, semiconductor device 200F may be without doped semiconductor layer 202 and dielectric layer 205B. Back side circuitry 210 may also include back side electrical interconnection 211 which may provide electrical interconnection between transistors 204. Interconnection 211 may include a number of metallization layers on the back side (e.g., a bottommost metallization layer on the back side, typically referred to as M0). At least one of the back side metallization layers may be disposed on the bottom surface of dielectric layer 205A. At least one of the back side metallization layers may serve power rail 212. Power rail 212 may be configured to provide to transistors 204 on the top surface of substrate 201 a power supply, which may be for example, a VDD (a relatively high voltage) or VSS (a relatively low, or ground voltage).

Figure 3:
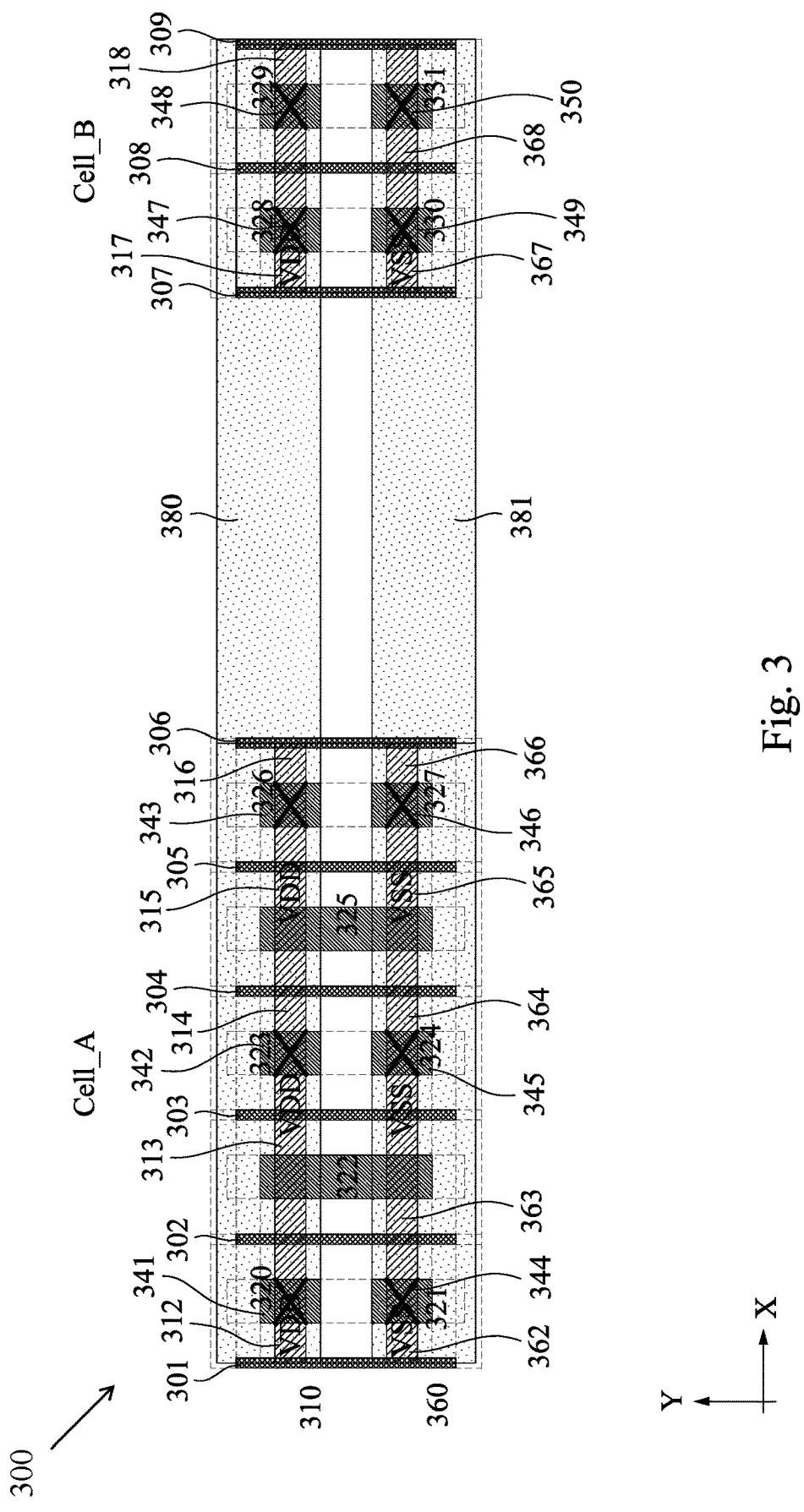
FIG. 3 illustrates an exemplary layout design of a structure, which includes a substrate with a buried doping layer, which has a front side circuit, but does not have a back side circuit formed.

FIG. 3 schematically illustrate an example of layout design 300 for structure 200. The layout design 300 includes two (standard) cells, 300A and 300B, abutted to each other along the X direction. Cells 300A and 300B share a common buried doping layer 380 and 381 extending along the X direction. Each of cells 200A and 200B may function as a respective circuit that includes one or more transistors operatively coupled to one another. Layout design 300 is simplified for illustrative purposes. Thus, layout design 300 may include other patterns.

Layout design 300 includes patterns 310 and 360 each extending along the X direction, each of which is configured to form an active region over a front side of a substrate (hereinafter "active regions 310 and 360"). Each of active regions 310 and 360 may include p-type of dopants or n-type of dopants. A type of dopants in active region 310 and a type of dopants in active region 360 may be the same or different. Each of active regions 310 and 360 may be one of a fin-shaped region of one or more three-dimensional field-effect-transistors (e.g., FinFETs), a sheet-shaped region of one or more gate-all-around (GAA) transistors (e.g., nanosheet transistors), a wire-shaped region of one or more GAA transistors (e.g., nanowire transistors), or an oxide-definition (OD) region of one or more planar metal-oxide-semiconductor field-effect-transistors (MOSFETs). Portions of the active region may each serve as a source structure or drain structure (or feature) of the respective transistor(s); and portions of the active region may each serve as a conduction channel of the respective transistor(s).

In an example where the layout design 300 is used to fabricate one or more GAA transistors, the portion of each of the active regions 310 and 360, overlaid by a gate structure (e.g., 301-309, which will be discussed below), can form a number of sets of nanostructures (e.g., nanosheets, nanowires, etc.) that are vertically separated from each other and extend along the X direction. Each of such sets of nanostructures can be configured as the channel of a respective GAA transistor. The portion of each of the active regions 310 and 360, not overlaid by a gate structure (e.g., 312-318, 362-368, which will also be discussed below), can form either a source or a drain structure of the respective GAA transistor.

Layout design 300 includes patterns 301, 302, 303, 304, 305, 306, 307, 308, and 309. The patterns 301-309 may extend along the Y direction, that are configured to form gate structures (hereinafter "gate structures 301-309," respectively). In an embodiment, the gate structures 301-309 may be initially formed as dummy (e.g., polysilicon) gate structures straddling respective portions of the active regions 310 and 360, and be later replaced by active (e.g., metal) gate structures.

In some embodiments, gate structure 301 and 306 may be disposed respectively along or over a first boundary and a second boundary of cell 300A and gate structures 307 and 309 may be disposed respectively along or over a first boundary and a second boundary of cell 300B. Boundary gate structures, such as gate structures 301, 306, 307 and 209, may not provide an electrical or conductive path, and may prevent or at least reduce/minimize current leakage across components between gate structures 301 and 306 in cell 300A and gate structures 307 and 309 in cell 300B. Boundary gate structures, such as gate structures 301, 306, 307 and 309, can include polysilicon lines or metal lines, which are sometimes referred to as poly on OD edge (PODEs). Such PODEs and the underlying active/dummy regions may be replaced with a dielectric material so as to electrically isolate a cell from another cell laterally (e.g., along the X direction) abutted to it, such as for isolating cell 300A from cell 300B.

Non-boundary gate structures, such as gate structures 302-305 of cell 300A and gate structure 308 of cell 300B, formed of one or more conductive materials (e.g., polysilicon(s), metal(s)), may overlay (e.g., wrap around) respective portions of active regions 310 and/or 360 to define one or more transistors. Continuing with the above example where the layout design 300 is used to fabricate one or more GAA transistors, each of non-boundary gate structure may correspond to a metal gate wrapping around respective portions of the active regions 310 and/or 360, with the non-overlapped portions of the active regions such as, 312, 313, 314, 315, 316, 317, 318, 362, 363, 364, 365, 367, and 368, serving as respective source/drain structures of the one or more GAA transistors.

Layout design 300, over the top of cell 300A and 300B, includes patterns 320, 321, 322, 323, 324, 325, 326, 327, 328, 329, 330 and 331. The patterns 320-331 are configured to form via interconnecting structures (hereinafter "via structures 320-331," respectively, which may sometimes be referred to as MD). One or more of via structures 320-327 may interconnect source/drain structures of cell 300A, i.e., one or more source/drain structures 312-316 and one or more of source/drain structures 362-366. For example, via structure 322 interconnects source/drain structure 313 and source/drain structure 363, while via structure 325 interconnects source/drain structure 315 and source drain structure 365. However, one or more via structure of cell 300A or cell 300B may not interconnect source/drain structures of the respective cell. For example, via structures 320, 321, 323, 324, 326, 327 of cell 300A and via structures 328-331 of cell 300B do not provide interconnections between source/drain structures. Via structures 320-327 of cell 300A may connect source/drain structures of cell 300A, i.e., source drain structures 312-316 and 362-366 to an interconnecting structure formed by a pattern 332 (hereinafter "interconnecting structure 332"). Similarly, via structures 328-321 of cell 300B can connect source/drain structures of cell 300B, i.e., source/drain structures 317, 318, 367, 368 to an interconnecting structure formed by a pattern 333 (hereinafter "interconnecting structure 333"). The interconnecting structures 332 and 333 may be formed on a front side of the substrate, e on which the active regions 310 and 360 are formed.

Layout design 300 includes back side via interconnections 341, 342, 343, 344, 345, 346, 347, 348, 349 and 350, which electrically connect transistors of cell 300A and cell 300B to buried doped layers 380 and 381. A buried doped layer, such buried doped layer 380 or 381 may extend over multiple cells, such as cell 300A or 300B. In FIG. 3, back side via interconnections 341, 342, 343 connect transistors of cell 300A formed along active region 310 to buried doped layer 380; back side via interconnections 344, 345, 346 connect transistors of cell 300A formed along active region 360 to buried doped layer 381; back side via interconnections 347 and 348 connect transistors of cell 300B formed along active region 310 to buried doped layer 380; back side via interconnections 349 and 350 connect transistors of cell 300B formed along active region 360 to buried doped layer 381.

Figure 4:
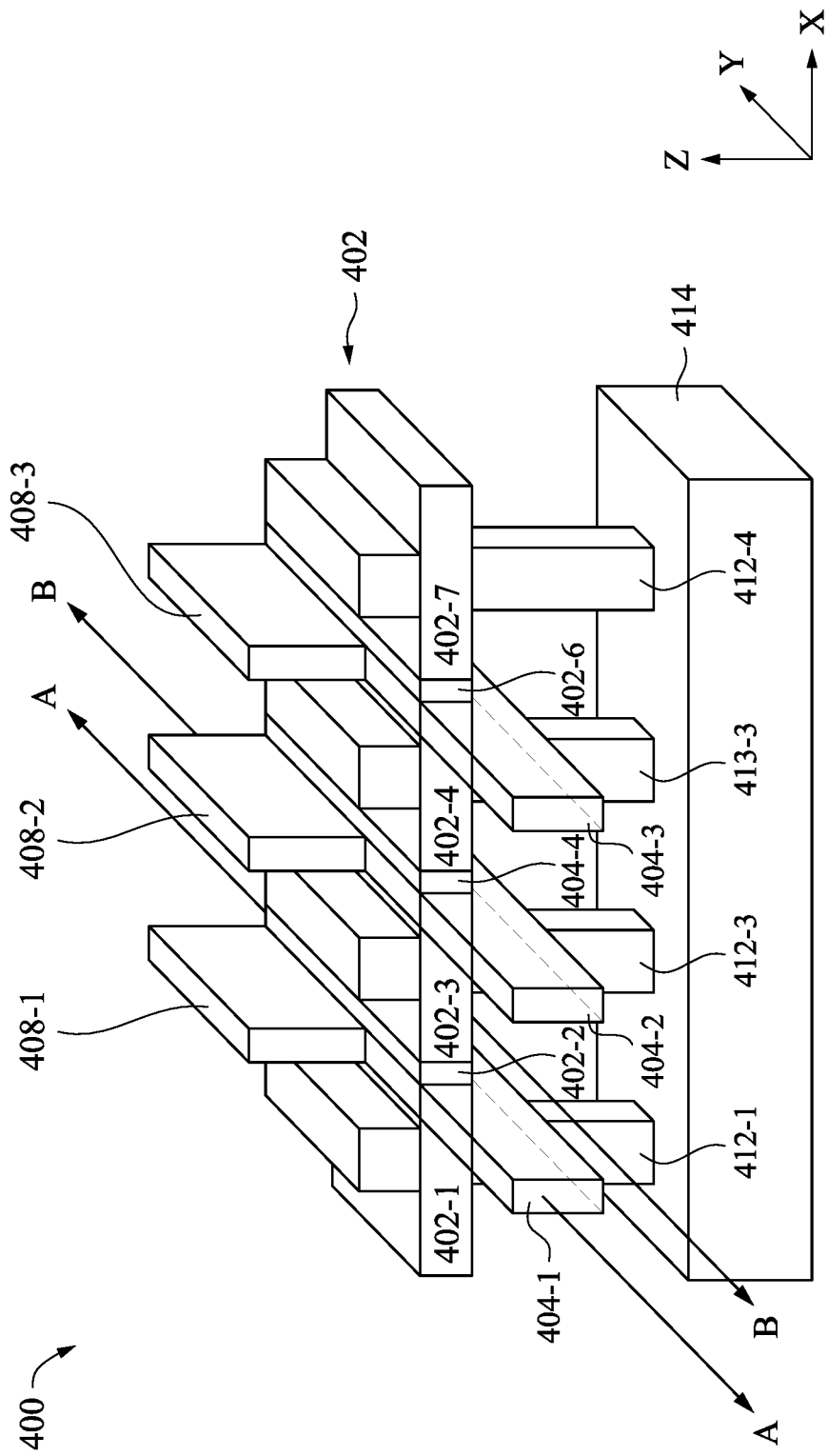
FIG. 4 provides a perspective view of an exemplary circuit ("front side circuit") formed on a front side of a substrate with a buried doping layer, which has a front side circuit, but does not have a back side circuit formed.

FIG. 4 provides a perspective view of structure 400, which includes an exemplary circuit ("front side circuit") 400 formed on a front side of a substrate with a buried doping layer, which has the front side circuit, but does not have a circuit formed on a back side of substrate, which is opposite to the front side. Structure 400 may be fabricated based on at least a portion of the layout design 300 of FIG. 3, e.g., cell 300A or 300B. For example, structure 400 includes a number of transistors formed on a front side of a substrate, a buried doped layer in the substrate and no circuit on a back side (opposite to the front side) of the substrate. Accordingly, the following discussions of FIG. 4 may be in conjunction with FIG. 3. In the illustrated embodiments of FIG. 4, the transistors on the front side of the substrate are implemented as GAA transistors. However, it should be understood that the transistors can be implemented as any of various other types of transistors, while remaining within the scope of the present disclosure.

In FIG. 4, structure 400 includes an active region 402, which may include a number of portions (or sub-regions)

402-1, 402-2, 402-3, 402-4, 402-5, 402-6, and 402-7. Active region 402 may be formed based on pattern 310 or 360 of FIG. 3. Structure 400 includes (e.g., active) gate structures 404-1, 404-2, and 404-3. Gate structures 404-1 through 404-3 may be formed based on three of patterns 301-309 of FIG. 3.

In certain embodiments, gate structure 404-1 can wrap around each of the nanostructures (e.g., nanosheets) of portion 402-2 that collectively function as the channel of a first GAA transistor; gate structure 404-2 can wrap around each of the nanostructures (e.g., nanosheets) of portion 402-4 that collectively function as the channel of a second GAA transistor; and gate structure 404-3 can wrap around each of the nanostructures (e.g., nanosheets) of portion 402-6 that collectively function as the channel of a third GAA transistor. Further, portions 402-1 and 402-3 disposed on opposite sides of gate structure 404-1 may function as respective source/drain structures of the first GAA transistor; portions 402-3 and 402-5 disposed on opposite sides of gate structure 404-2 may function as respective source/drain structures of the second GAA transistor; and portions 402-5 and 402-7 disposed on opposite sides of gate structure 404-3 may function as respective source/drain structures of the third GAA transistor.

Structure 400 includes interconnecting structures 406-1, 406-2, 406-3, and 406-4 disposed over (e.g., electrically connected to) the portions (source/drain structures) 402-1, 402-3, 402-5, and 402-7, respectively. Such interconnecting structures 406-1-4, connecting to the source/drain structures, may sometimes be referred to as MD. Structure 400 may further include interconnecting structure 408-1, 408-2, and 408-3. The interconnecting structures 408-1-3 are disposed over (e.g., electrically connected to) the gate structures 404-1-3, respectively. Such interconnecting structures 408-1-3, connecting to the gate structures, may sometimes be referred to as VG. 9

Active region 402, gate structures 404-1 through 404-3, and the interconnecting structures 408-1 through 408-3, are formed on a front side of a substrate (not shown). Specifically, the interconnecting structures 408-1 through 408-3 may comprise a number of metallization layers on the front side (e.g., a bottommost metallization layer on the front side, typically referred to as MO). Interconnecting structures 408-1 through 408-3 may correspond to interconnect structures 206 in FIGS. 2A-C.

Structure 400 further includes buried doped semiconductor layer 414 within a depth of the substrate. Buried doped semiconductor layer 414 in FIG. 4 may correspond to element 380 or 381 in FIG. 3 or to element 202 in FIGS. 2A-B. Buried doped semiconductor layer 414 may be electrically connected or coupled to one or more of source/drain structures 402-1, 402-3, 402-5, and 402-7 through one or more interconnecting structures, such as structures 412-1, 412-2, 412-3, and 412-4, respectively. Interconnecting structures 412-1 through 412-4 may be formed based on four of patterns 341-350 of FIG. 3. Interconnecting structures 412-1 through 412-4, may be formed of a doped semiconductor and may correspond to structures 207 in FIGS. 2A-B.

Structure 400 may also correspond to semiconductor 200F of FIG. 2C. In such case, element 414 may correspond to back side rail 212 in FIG. 2C, while interconnecting structures 412-1 through 412-4 may be formed instead of a doped semiconductor, of a metal which may be, for example, selected from tungsten, ruthenium, titanium and their alloys.

Figure 5:
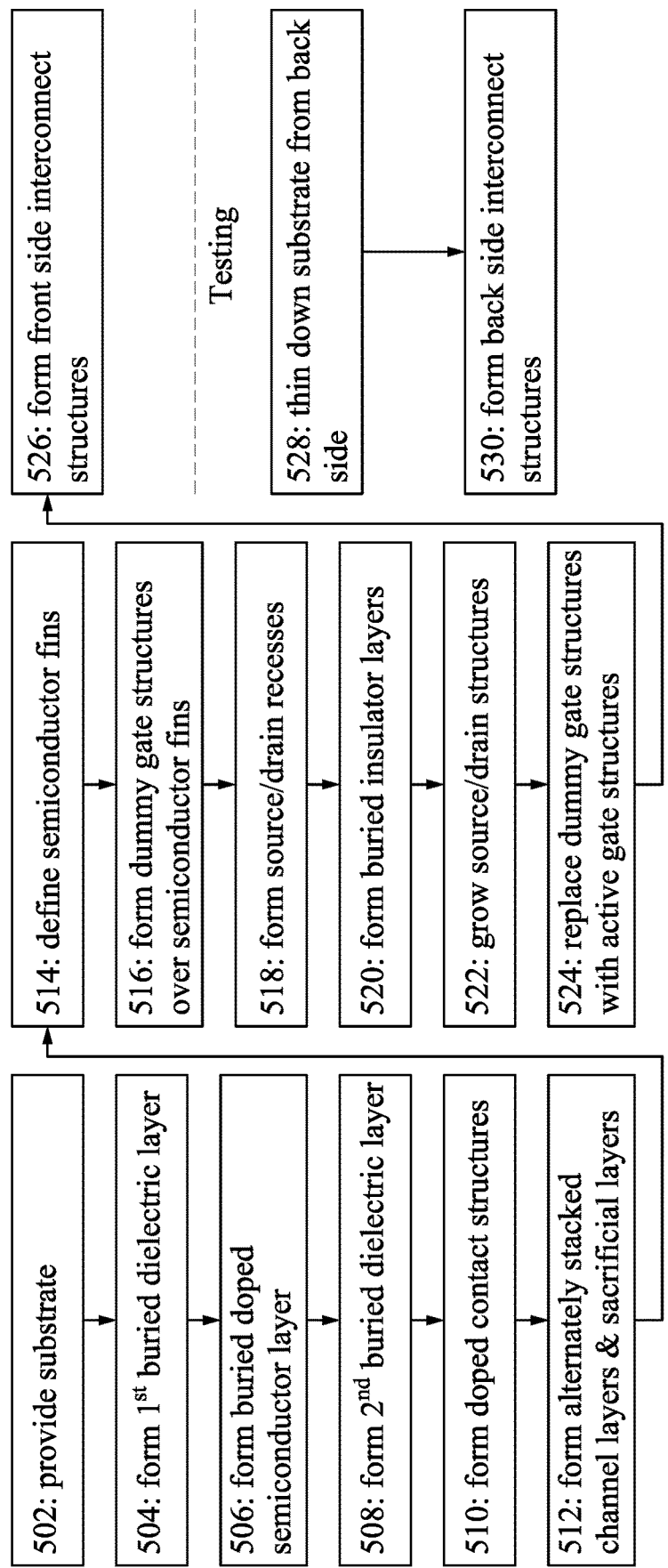
FIG. 5 is a flow chart of a process flow of an exemplary method of making a semiconductor device, which involves testing a front side circuitry before forming a back side circuitry.

FIG. 5 provides a flow chart for method 500 of making a semiconductor device, which allows testing a front side circuitry, including front side interconnections, i.e. a circuitry of a front side of a substrate, before forming a back side circuitry, including interconnections, on a back side (opposite to the front side) of the substrate. At least some operations of method 500 may be used to form the semiconductor device which includes one or more non-planar structures For example, the semiconductor device may include one or more gate-all-around (GAA) transistors. However, it should be understood that the transistors of the semiconductor device may be each configured in any of various other types of transistors such as, for example, a FinFET, a planar complementary metal-oxide-semiconductor (CMOS) transistor, while remaining within the scope of the present disclosure.

Method 500 is merely an example, and is not intended to limit the present disclosure. Accordingly, additional operations may be provided before, during, and/or after method 500, and that some other operations may only be briefly described herein. Some operations of method 500 may be associated with the views shown in FIGS. 2-4. Some operations of method 500 are illustrated in FIG. 6A-G.

Method 500 may start with operation 502 of providing a semiconductor substrate. The semiconductor substrate may be a semiconductor substrate, such as a bulk semiconductor, which may be doped (e.g., with a p-type or an n-type dopant) or undoped. When a doped substrate is used, a dopant concentration (a concentration of doping impurities) in the substrate may be less that in the buried doped semiconductor layer. For example, a dopant concentration in the substrate is less in the buried doped semiconductor layer by at least 2 time or by at least 5 times, or by at least 10 times or by at least 20 times or by at least 50 times or by at least 100 times. The substrate may be a wafer, such as a silicon wafer. In some embodiments, the bulk semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Following operation 502, method 500 may include operation 504 of forming a first buried dielectric layer, such as a buried oxide layer. The buried oxide layer may be a layer of an oxide of the semiconductor forming the substrate. For example, in a bulk silicon substrate, the buried oxide layer may be a silicon oxide layer. The buried oxide layer may be formed, for example, by implanting oxygen ions within a thickness of the bulk semiconductor substrate through the top surface of the substrate followed by annealing the bulk semiconductor substrate with the implanted oxygen ions. The first buried dielectric layer may be formed substantially parallel to a top surface of the substrate at a distance from the top surface shorter than the thickness of the substrate. The first buried dielectric layer may extend in at least one, i.e. one or two, lateral direction, i.e. a direction parallel to the top surface of the substrate. In certain embodiments, following the forming of the first buried dielectric layer a first additional semiconductor may be grown on the top surface of the substrate. The first additional semiconductor may be the same or different from the bulk semiconductor of the original substrate. The growth of the first additional semiconductor may be performed by a known semiconductor growth method, such as chemical vapor deposition, including epitaxial growing.

The first buried dielectric layer and the second buried dielectric layer, each of which may be a buried oxide layer, may prevent dopants from the buried doped semiconductor layer from penetrating or diffusing other areas of the substrate.

FIG. 6A-C may illustrate operation 504 of forming a first buried dielectric layer, such as a buried oxide layer. FIG. 6A illustrates implanting oxygen ions into semiconductor substrate 601, which may be a bulk silicon substrate. FIG. 6B illustrates annealing the bulk semiconductor substrate 601 with the implanted oxygen ions to form buried oxide layer 602. FIG. 6C growing the first additional semiconductor may be performed by a known semiconductor growth method, such as chemical vapor deposition, including epitaxial methods. After operation 504, substrate 601 may include a top semiconductor layer, such as layer 604; the $1^{st}$ buried dielectric layer, such as buried oxide layer 602, under top semiconductor layer 604, and a bottom semiconductor layer, such as layer 603, under buried oxide layer 602.

Following operation 504, method 500 may include operation 506 of forming a buried doped semiconductor layer above the $1^{st}$ buried dielectric layer. For example, a layer of the semiconductor material of the substrate, which may include at least a portion of the first additional semiconductor, right above the $1^{st}$ buried dielectric layer may be implanted the top surface of the substrate with n-type or p-type doping impurities. In case of a Group IV semiconductor, such as silicon or germanium, as a bulk material of the substrate, a p-type doping impurity may be a Group III dopant, such as B, Al, In or Ga; and an n-type dopant may be a Group V dopant, such as P, As, Sb or Bi. Following the implantation of the doping impurities, the substrate may be annealed. A concentration of the doping impurities in the doped semiconductor layer may vary. In some embodiments, for example, the concentration of the doping impurities may be from $1\times10^{13}$ cm$^{-3}$ to $1\times10^{18}$ cm$^{-3}$ or from $1\times10^{14}$ cm$^{-3}$ to $1\times10^{17}$ cm$^3$ or from $0.5\times10^{15}$ cm$^{-3}$ to $1\times10^{16}$ cm$^{-3}$ or from $1\times10^{15}$ cm$^{-3}$ to $1\times10^{16}$ cm$^{-3}$, such as $3\times10^{15}$ cm$^{-3}$. In some embodiments, the concentration of the doping impurities may be greater than $1\times10^{18}$ cm$^{-3}$.

Following operation 506, method 500 may include operation 508 of forming a second buried dielectric layer, which may be a buried oxide layer, in a portion of the bulk semiconductor of the substrate above the above the buried doped semiconductor layer. Formation of the second buried dielectric layer may be similar to the formation of the first buried dielectric layer. For example, it may include implanting oxygen atoms in a portion of the bulk semiconductor of the substrate above the buried doped semiconductor layer following by annealing. In some embodiments, annealing for the second buried dielectric layer and for the buried doped semiconductor layer may be combined. In other words, implanting of oxygen atoms for the second buried dielectric layer may be performed after implanting the n-type or p-type doping impurities for the buried doped semiconductor layer (but without annealing). The combined annealing for both the second buried dielectric layer and the buried doped semiconductor layer may be conducted after the oxygen atoms for second buried dielectric layer were implanted.

FIG. 6D-F illustrate operations 506 and 508. FIG. 6D illustrates dopant implantation into top semiconductor layer 604 above first dielectric layer 602 to define doped semiconductor layer 605. FIG. 6E illustrates oxygen ions implantation in a portion of top semiconductor layer 604 above doped semiconductor layer 605 to define second dielectric layer 606, which may be an oxide layer, i.e. a layer of an oxide of the semiconductor of top semiconductor layer 604.

FIG. 6F illustrates annealing of substrate 601 to finish formation doped semiconductor layer 605 and second dielectric layer 606.

After operation 508, substrate 601 may include the following layers from the top to the bottom: second buried dielectric layer 606, buried doped semiconductor layer 605, first buried dielectric layer 602 and bottom semiconductor layer 603. As such a depth of first buried dielectric layer 602 from the top surface of substrate 601 is greater than a depth of buried doped semiconductor layer 605, which in turn is greater than a depth of second buried dielectric layer 606.

Operations 510-526 provide exemplary steps for forming a front side circuitry on a top surface of the front side semiconductor layer. For forming the front side circuitry, it may be possible to use a layout design, such as a portion of the layout design 300.

Operation 510 may include forming doped contact structures extending from the buried doped semiconductor layer to the top surface of the substrate through the second buried dielectric layer. For example, FIG. 6F shows doped contact structures 607 vertically extending from doped semiconductor layer 605 to the top surface of substrate 601. Doped contact structures 607 comprise a n-doped or p-doped semiconductor and may correspond to interconnecting structure (s) 207 in FIGS. 2A and 2B, structures 412-1-412-4 in FIG. 4 or structures 341-350 in FIG. 3. In some embodiments, the doped contact structures may be doped SiGe structures.

Operation 512-524 are exemplary steps for forming GAA transistors on the top surface of the substrate so that at least some of the GAA transistors are electrically connected to the buried doped semiconductor layer through the contact structures, such as doped contact structures 607 in FIGS. 6F-G, structures 207 in FIGS. 2A-B, structures 412-1-412-4 in FIG. 4 or structures 341-350 in FIG. 3, formed in operation 510. In some embodiments, each of the GAA transistors may be have one of its source/drain structures, such as source/drain structures 402-1, 402-3, 402-5 in FIG. 4, may be electrically coupled or connected to the buried doped semiconductor layer, such as layer 605 in FIGS. 6F-G, layer 202 in FIGS. 2A-2B, element 414 in FIG. 4 or elements 380 or 381 in FIG. 3, through the contact structures, such as doped contact structures 607 in FIGS. 6F-G, structures 207 in FIGS. 2A-B, structures 412-1-412-4 in FIG. 4 or structures 341-350 in FIG. 3, formed in operation 510. The GAA transistors may be formed by at least some of the following process steps: forming a fin structure protruding from the substrate, wherein the fin structure includes a number of first nanostructures and a number of second nanostructures alternately stacked on top of one another; forming a number of dummy gate structures straddling the fin structure; forming one or more pairs of source/drain structures in the fin structure, each pair disposed on opposite sides of each of the dummy gate structures and at least one of the source/drain structures in electrically connected to doped contact structures, such as doped contact structures 607 in FIGS. 6F-G, structures 207 in FIGS. 2A-B, structures 412-1-412-4 in FIG. 4 or structures 341-350 in FIG. 3; removing the dummy gate structures; removing the first nanostructures; and forming a number of active (e.g., metal) gate structures.

Operation 512 involves forming a plurality of channel layers, which may be semiconductor layers, and a plurality of sacrificial layers, which may be for example, sacrificial polysilicon layers, the channel layers and the sacrificial layers being stacked in an alternating order. Both channel layers and sacrificial layers may be formed via an epitaxial deposition technique. Thus, operation 512 may involve forming a stack of epitaxy layers, which includes a plurality of semiconductor epitaxy layers and a plurality of sacrificial epitaxy layers stacked in an alternating sequence.

Operating 514 involves defining and forming a fin structure including a stack of strips orientated in a first direction by patterning the stack that includes the plurality of channel layers, which may be semiconductor layers, and the plurality of sacrificial layers, stacked in an alternating sequence. For example, operation 514 may involve forming the fin structure that includes a stack of strips by patterning the stack of epitaxy layers, which includes the plurality of semiconductor epitaxy layers and the plurality of sacrificial epitaxy layers stacked in an alternating sequence, the stack of strips including the plurality of semiconductor strips and the plurality of sacrificial strips formed by patterning the plurality of the semiconductor layers and the plurality of sacrificial layers, respectively.

Operation 516 involves forming a sacrificial gate structure (dummy gate) of the fin structure formed in operation 514. The dummy gate may include, for example, a sacrificial polysilicon layer, a sacrificial cap layer, and/or a sacrificial dielectric layer. The sacrificial cap layer and the sacrificial liner layer may be silicon oxide or other suitable dielectric materials.

Operation 518 involves forming source/drain recesses by strips by removing portions of the plurality of sacrificial strips, the receded sacrificial strips each including recessed edge surfaces.

Operation 520 involves forming buried insulator or dielectric layer(s), which may be a buried oxide layer, in the substrate. Considering that the substrate already includes the first and the second buried dielectric layers, such as layers 602 and 606 in FIG. 6, operation 520 may be optional. Buried insulator or dielectric layer(s) may be used for stopping thinning the substrate in operation 528.

Operation 522 involves forming source/drain structures. The source/drain structures may be formed adjacent to the plurality of receded sacrificial strips and the plurality of semiconductor strips.

Operation 524 involves replacing the dummy gate structure with an active, i.e. conductive gate structure, which may be formed of an electrically conductive material, such as a metal. Operation 524 may involve removing the dummy gate and the sacrificial strips, leaving an open space and forming the replacement conductive gate in the open space.

Operation 526 involves forming front side interconnecting structures, such as for example, structures 206 in FIG. 2A. This operation may involve depositing a number of metallization layers, which will provide interconnections between transistors formed on the front side of the substrate.

Following operation 526, the formed structure may be structure 200 of FIG. 2A. Such structure may be exposed to testing 102 of FIG. 1. If the front side circuitry of the structure does not pass testing 102, then it may be discarded. If the front side circuitry of the structure passes testing 102, then the structure may be used for forming a back side circuitry.

In some embodiments, forming the back side circuitry may include operation 528, which may involve thinning the substrate from the back side. Such thinning, for example, may involve removing bottom semiconductor layer 603, first buried dielectric layer 602 and buried doped semiconductor layer 605. As the result of the thinning, the bottom of second semiconductor layer 606 may get exposed.

In addition to operation 528, forming the back side circuitry may include operation 530 of forming back side interconnection structure(s) of the exposed back side surface of the second buried dielectric layer, such as layer 606 or 205A. Forming the back side interconnecting structures may involve replacing the doped semiconductor in the doped contact structures, such as structures 607 or structures 207, with a metal, which may be, for example, be selected from tungsten, ruthenium, titanium or their alloys, to form metal contact structures, such structures 207F. Forming the back side interconnecting structures may also involve forming a number of back side metallization layers. At least one of the back side metallization layers may function as a power rail, such as power rail 212 in FIG. 2C. The back side interconnecting structures may be formed by one or more of the following process steps: forming a number of via structures connecting each of the (merged) source/drain structures; and forming the back side interconnecting structure(s) connecting the via structures together. As such, the back side interconnecting structure(s) can connect the respective source/drain structures of the GAA transistors together.

Following the formation of the back side interconnecting structures, the formed semiconductor device with the front side circuitry and the back side circuitry may undergo final testing.

In one aspect of the present disclosure, a method of making a semiconductor device is disclosed. The method comprises doping a region through a first surface of a semiconductor substrate, wherein the region extends along at least a lateral direction; forming a plurality of doped structures within the semiconductor substrate, wherein each of the plurality of doped structures extends along a vertical direction and is in contact with the doped region; forming a plurality of transistors over the first surface, wherein each of the transistors comprises one or more source/drain structures electrically coupled to the doped region through a corresponding one of the doped structures; forming a plurality of interconnect structures over the first surface, wherein each of the interconnect structures is electrically coupled to at least one of the transistors; and testing electrical connections between the interconnect structures and the transistors based on detecting signals present on the doped region through a second surface of the semiconductor substrate, the second surface opposite to the first surface.

In another aspect of the present disclosure, a method of making a semiconductor device is disclosed. The method comprises forming a doped layer through a first surface of a semiconductor substrate; forming a plurality of transistors over the first surface of the semiconductor substrate, wherein the plurality of transistors are operatively coupled to the doped layer; coupling the transistors to one another by forming a plurality of first interconnect structures over the first surface; applying test signals through the first interconnect structures; and examining electrical connections between the transistors and the first interconnect structures by monitoring signals present on the doped layer from a second surface of the semiconductor substrate, the second surface opposite to the first surface.

In yet another aspect of the present disclosure, a method for making a semiconductor device is disclosed. The method comprises doping, with semiconductor impurities, a region buried in a semiconductor substrate; forming a plurality of gate-all-around (GAA) transistors on a first side of the semiconductor substrate, wherein the plurality of transistors are operatively coupled to the doped region; electrically coupling the GAA transistors to one another by forming a plurality of interconnect structures on the first side; applying test signals through the interconnect structures; placing a microscopy on a second side of the semiconductor substrate, the second side opposite to the first side; determining, based on results detected by the microscopy, that issues of electrical connections between the GAA transistors and the interconnect structures do not exist or a number of the issues is within a threshold; removing the doped region; and forming, on the second side of the semiconductor substrate, one or more power rails electrically coupled to the GAA transistors.

Yet another embodiment is a system for testing a semiconductor device, comprising: a semiconductor device and a testing device. The semiconductor device comprises a semiconductor substrate having a buried doped layer within a thickness of the substrate, a plurality of gate-all-around (GAA) transistors on a first side of the semiconductor substrate, wherein the plurality of transistors are operatively coupled to the buried doped layer; and a plurality of interconnect structures between the GAA transistors of said plurality on the first side of the semiconductor substrate. The testing device is on a second side of the semiconductor substrate, the second side opposite to the first side. The testing device is configured to test electrical connections in the plurality of interconnect structures between the GAA transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for testing a semiconductor structure, comprising:
   the semiconductor structure, including:
      a semiconductor substrate including a first side and a second side opposite the first side;
      a doped layer buried below the first side;
      a plurality of gate-all-around (GAA) transistors disposed over the first side wherein each GAA transistor includes: a stack of channel layers extending vertically from the semiconductor substrate; a gate structure wrapping around the stack of channel layers; and source/drain structures on opposite sides of the gate structure; wherein each of the GAA transistors is coupled to the doped layer through a respective doped semiconductor contact structure extending vertically through the semiconductor substrate; and
      a plurality of interconnect structures coupled to the source/drain transistors over the first side;
   a tester disposed over the first side and configured to apply an electrical signal to the doped layer through the interconnect structures; and
   a testing device disposed over the second side and configured to test electrical connections in the semiconductor structure in response to the applied electrical signal.

2. The system of claim 1, wherein the testing device is a microscope.

3. The system of claim 2, wherein the microscope is at least one of an emission microscope (EMMI), a laser scanning microscope, or an electron beam irradiation (EBI) microscope.

4. The system of claim 1, wherein the doped layer includes an n-type dopant or a p-type dopant.

5. The system of claim 1, wherein the semiconductor substrate further includes a first dielectric layer over a second dielectric layer, the doped layer being sandwiched between the first dielectric layer and the second dielectric layer.

6. The system of claim 1, wherein the source/drain structures each include epitaxially grown semiconductor material.

7. The system of claim 1, wherein the interconnect structures are first interconnect structures, the semiconductor structure further including second interconnect structures each coupling one of the transistors to the doped layer.

8. A system for testing a semiconductor device, comprising:
   the semiconductor device, including:
      a substrate having a front side and a back side opposite the front side;
      a doped semiconductor sacrificial layer disposed between a first dielectric layer and a second dielectric layer within the substrate;
      a gate-all-around (GAA) transistor on the front side, wherein the GAA transistor includes: a stack of semiconductor channel layers extending vertically from the substrate; a gate structure wrapping around each of the semiconductor channel layers; and source/drain features disposed on opposite sides of the gate structure;
      wherein the GAA transistor is coupled to the sacrificial layer through a doped semiconductor contact structure extending vertically through the first dielectric layer, and
      a metallization layer on the front side and coupled to one of the source/drain features of the GAA transistor;
   a tester configured to apply an electrical signal to the sacrificial layer through the metallization layer; and
   a testing device on the back side and configured to test electrical connections between the metallization layer and the GAA transistor in response to the applied electrical signal.

9. The system of claim 8, wherein the sacrificial layer includes an n-type dopant or a p-type dopant.

10. The system of claim 8, wherein the source/drain features each include epitaxially grown semiconductor material.

11. The system of claim 8, wherein the metallization layer is a first metallization layer, the semiconductor device further including a second metallization layer coupling one of the source/drain features to the sacrificial layer.

12. The system of claim 8, wherein the testing device includes a photon microscope or an electron beam microscope.

13. The system of claim 12, wherein the testing device includes an emission microscope configured to detect light emission associated with a defect of the semiconductor device.

14. The system of claim 8, wherein the substrate further includes a first oxide layer and a second oxide layer, and wherein the sacrificial layer is between the first oxide layer and the second oxide layer.

15. The system of claim 8, wherein the semiconductor device further includes a topmost metallization layer coupling the interconnect structure to the tester.

16. The system of claim 8, wherein the GAA transistor is a first GAA transistor and the metallization layer is a first metallization layer, the semiconductor device further including:
- a second metallization layer coupling the first GAA transistor to the sacrificial layer;
- a second GAA transistor on the front side;
- a third metallization layer coupling the second GAA transistor to the tester; and
- a fourth metallization layer coupling the second GAA transistor to the sacrificial layer.

17. The system of claim 16, wherein the first transistor is disposed in a first standard cell and the second transistor is disposed in a second standard cell.

18. A system for testing a semiconductor device, comprising:
- the semiconductor device, including:
- a substrate having a front side and a back side opposite the front side;
- a doped layer buried within the substrate;
- a first dielectric layer buried between the doped layer and the front side and a second dielectric layer buried between the doped layer and the back side;
- a first standard cell including a first gate-all-around (GAA) transistor having a first stack of semiconductor channel layers extending vertically from the substrate and a first gate structure wrapping around each channel layer in the first stack and a first interconnect structure coupled to a source/drain feature of the first GAA transistor on the front side, the first GAA transistor being further coupled to the doped layer through a first doped semiconductor contact structure extending vertically through the first dielectric layer; and
- a second standard cell including a second GAA transistor having a second stack of semiconductor channel layers extending vertically from the substrate and a second gate structure wrapping around each channel layer in the second stack and a second interconnect structure coupled to a source/drain feature of the second GAA transistor on the front side, the second GAA transistor being further coupled to the doped layer through a second doped semiconductor contact structure extending vertically through the first dielectric layer;
- a tester configured to apply an electrical signal to the doped layer through the first and second interconnect structures; and
- a testing device on the back side and configured to test electrical connections in the first and second standard cells in response to the applied electrical signal, the testing device including a microscope.

19. The system of claim 18, wherein the source/drain features of the first and second GAA transistors each include epitaxially grown semiconductor material.

20. The system of claim 18, wherein the first standard cell further includes a third interconnect structure coupling the first GAA transistor to the doped layer and the second standard cell further includes a fourth interconnect structure coupling the second GAA transistor to the doped layer.

* * * * *